United States Patent
Choi et al.

(10) Patent No.: US 8,247,808 B2
(45) Date of Patent: Aug. 21, 2012

(54) ORGANIC LIGHT EMITTING LIGHTING APPARATUS

(75) Inventors: Sung-Jin Choi, Yongin (KR); Ok-Keun Song, Yongin (KR); Young-Mo Koo, Yongin (KR); Doo-Hwan Kim, Yongin (KR); Min-Woo Lee, Yongin (KR); Jae-Goo Lee, Yongin (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 86 days.

(21) Appl. No.: 12/878,290

(22) Filed: Sep. 9, 2010

(65) Prior Publication Data

US 2011/0068688 A1  Mar. 24, 2011

(30) Foreign Application Priority Data

Sep. 23, 2009  (KR) .................. 10-2009-0090285

(51) Int. Cl.
*H01L 33/00* (2010.01)

(52) U.S. Cl. .......................................... 257/40; 257/72

(58) Field of Classification Search .............. 257/40, 257/72, 79–103, E39.007, E51.006–E51.007
See application file for complete search history.

(56) References Cited

U.S. PATENT DOCUMENTS

| | | | | |
|---|---|---|---|---|
| 7,115,898 B2 * | 10/2006 | Hirai | | 257/40 |
| 7,385,347 B2 | 6/2008 | Song et al. | | |
| 7,518,148 B2 * | 4/2009 | Liu et al. | | 257/79 |
| 7,564,185 B2 | 7/2009 | Song et al. | | |
| 2006/0066223 A1 | 3/2006 | Pschenitzka | | |
| 2011/0204343 A1 * | 8/2011 | Birnstock et al. | | 257/40 |

FOREIGN PATENT DOCUMENTS

| | | |
|---|---|---|
| JP | 2003-334308 | 11/2003 |
| JP | 2004287032 | 10/2004 |
| JP | 2004296154 | 10/2004 |
| JP | 2007207569 A | 8/2007 |
| KR | 10-2003-0026424 | 4/2003 |
| KR | 100743052 B | 7/2007 |

* cited by examiner

*Primary Examiner* — Cuong Q Nguyen
(74) *Attorney, Agent, or Firm* — Robert E. Bushnell, Esq.

(57) ABSTRACT

An organic light emitting lighting device that includes a transparent substrate, a first electrode layer formed on the substrate, an organic emission layer formed on the first electrode layer, a second electrode line formed of a plurality of second electrode lines disposed in parallel with each other on the organic emission layer, a first fuse unit having one end connected with the first electrode layer, and a plurality of second fuses having one end respectively connected to one end of the plurality of second electrode lines.

17 Claims, 5 Drawing Sheets

ORGANIC LIGHT EMITTING LIGHTING APPARATUS

CLAIM OF PRIORITY

This application makes reference to, incorporates into this specification the entire contents of, and claims all benefits accruing under 35 U.S.C. §119 from an application earlier filed in the Korean Intellectual Property Office filed on Sep. 23, 2009 and there duly assigned Serial No. 10-2009-0090285.

BACKGROUND OF THE INVENTION

1. Field of the Invention

The present invention relates to an organic light emitting lighting device.

2. Description of the Related Art

An organic light emitting diode (OLED) has a hole injection electrode, an organic emission layer, and an electron injection electrode. The organic light emitting diode emits light by way of energy generated when excitons being combinations of electrons and holes within an organic emissive layer fall from an excited state to a ground state.

Organic light emitting diode lighting equipment is based on an organic light emitting diode, and functions as a surface light source. Organic light emitting diode lighting equipment is used for various purposes because of the merits of the surface light source, and the usage thereof is gradually increasing.

The above information disclosed in this Background section is only for enhancement of understanding of the background of the invention and therefore it may contain information that does not form the prior art that is already known in this country to a person of ordinary skill in the art.

SUMMARY OF THE INVENTION

An organic light emitting lighting device is discussed having an advantage of preventing an over-current (current deflection) due to a defect of an organic light emitting diode, and damage to the organic lighting emitting diode due to the current deflection.

In addition, the organic light emitting lighting device has an advantage of reducing the size of an organic light emitting diode, while preventing an over-current (current deflection) due to a defect of the organic light emitting diode and damage to the organic lighting emitting diode due to the current deflection.

An organic light emitting lighting device according to an exemplary embodiment of the present invention includes: a transparent substrate; a first electrode layer formed on the substrate; an organic emission layer formed on the first electrode layer; a second electrode line formed of a plurality of second electrode lines disposed in parallel with each other on the organic emission layer; a first fuse unit having one end connected with the first electrode layer; and a plurality of second fuses having one end respectively connected to one end of the plurality of second electrode lines.

The first electrode may be an anode and the second electrode line may be a cathode.

The first electrode layer may be formed of a first electrode that may be one planar electrode, and the first fuse unit may be formed of a fuse having one end connected with the first electrode.

The fuse capacity of the first fuse may be different from that of the second fuse.

The fuse capacity of the first fuse may be greater than that of the second fuse.

The first electrode layer may be formed of a plurality of first electrode lines that are disposed in parallel with each other.

The first fuse unit may be formed of a plurality of first fuses having one end respectively connected to one end of the plurality of first electrode lines.

The organic light emitting lighting device further includes a power supply connected with the other end of the first fuse and applying a first voltage to the first electrode line, and connected to the other end of the second fuse and applying a second voltage that may be lower than the first voltage to the second electrode line.

The second electrode line may be perpendicular to the first electrode line.

The second electrode line may be parallel with the first electrode.

The organic light emitting lighting device further includes an insulation layer or a separator formed between neighboring first electrode lines.

The first fuse unit or the plurality of fuses may be formed on the substrate.

The first fuse unit or the plurality of fuses may be formed on a driver that drives the organic emission layer for light emission.

The first fuse unit or the plurality of fuses may be formed on a pad area that connects the organic emission layer and the driver that drives the organic emission layer for light emission.

The organic light emitting lighting device according to the exemplary embodiment of the present invention can prevent damage to a light emitting element when a defect occurs at a portion of the organic emission layer. Further, a decrease of the entire luminance can be prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments of the present invention, detailed description is given for constituent elements in the first exemplary embodiment with reference to the relevant drawings by using the same reference numerals for the same constituent elements, while only different constituent elements from those related to the first exemplary embodiment are described in other exemplary embodiments.

Parts that are irrelevant to the description are omitted in order to clearly describe the present invention, and like reference numerals designate like elements throughout the specification.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present.

Figure 1:
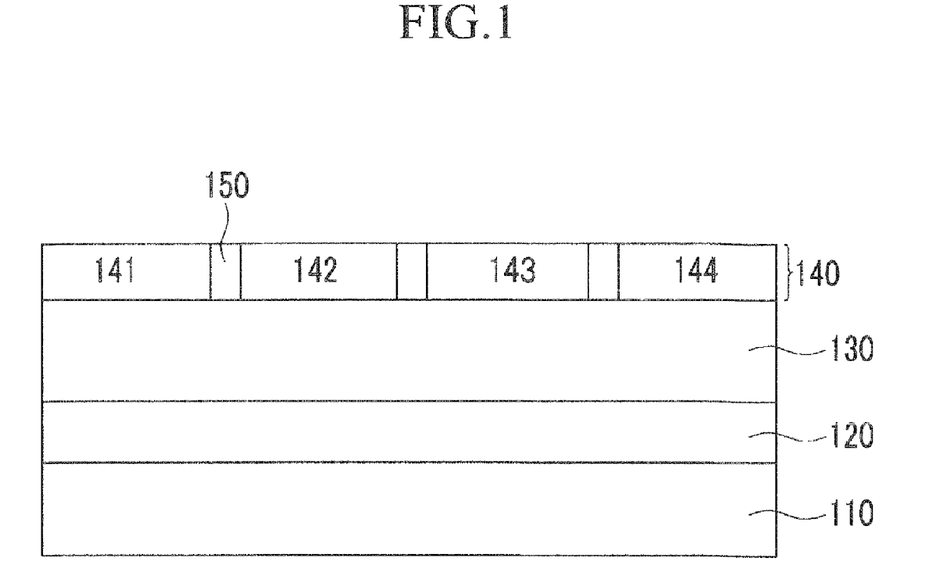
FIG. 1 is a cross-sectional view of an organic light emitting lighting device according to an exemplary embodiment of the present invention.

FIG. 1 is a cross-sectional view of an organic light emitting lighting device according to an exemplary embodiment of the present invention.

Referring to FIG. 1, an organic light emitting lighting device according to an exemplary embodiment of the present invention includes a substrate 110, a first electrode layer 120, an organic emission layer 130, and a second electrode layer 140. Here, the second electrode layer 140 is formed of a plurality of second electrode lines 141, 142, 143, and 144. The organic light emitting lighting device may further include an insulation layer 150 disposed between neighboring second electrode lines.

Here, the first electrode layer 120, the organic emission layer 130, and the second electrode layer 140 form an organic light emitting diode (OLED) for lighting.

The substrate 110 is formed of a transparent insulative material, and may be called a transparent substrate. In further detail, the substrate 110 may be formed as an insulative transparent substrate made of glass, quartz, ceramic, or plastic. In addition, the substrate 110 may be divided into an emitting area EA where the OLED is disposed and light is emitted, and a pad area PA. The emitting area EA and the pad area PA will be described later with reference to FIG. 5. FIG. 1 shows a portion formed above the emitting area EA of the substrate 110.

The first electrode layer 120 is formed of a transparent conductive material on the substrate 110. The transparent conductive material forming the first electrode layer 120 may include indium tin oxide (ITO), indium zinc oxide (IZO), or zinc oxide (ZnO). In addition, the first electrode layer 120 functions as a metal layer forming a positive (+) electrode which is a hole injection electrode.

The organic emission layer 130 is formed of a low molecular organic material or a high molecular organic material. The organic emission layer 130 may be formed of a multi-layered structure with at least one of an emission layer, a hole injection layer (HIL), a hole transport layer (HTL), an electron transport layer (ETL), and an electron injection layer (EIL). If the organic emissive layer 720 has all of the layers, the hole injection layer (HIL) is adjacently disposed on the first electrode 710 being the positive electrode, and the hole transporting layer (HTL), the emissive layer, the electron transporting layer (ETL), and the electron injection layer (EIL) are sequentially stacked on the hole injection layer.

The second electrode layer 140 is a conductive material including various types of metals. In addition, the second electrode layer 140 functions as a metal layer forming a negative (−) electrode, which is an electron injection electrode.

The insulation layer 150 is disposed between neighboring second electrodes (e.g., 141 and 142) for electrical insulation therebetween. The insulation layer 150 may be formed as an inorganic layer made of a material such as silicon oxide (SiO2) or silicon nitride (SiNx). However, the insulation layer 150 may be omitted if insulation between the second electrode lines 141, 142, 143, and 144 is guaranteed. For example, the organic emission layer 130 may function as the insulation layer 150 if disposed between neighboring second electrode lines, and in this case, the insulation layer 150 can be omitted. In addition, instead of the insulation layer 150, a separator may be disposed where the insulation layer 150 is disposed.

Hereinafter, the organic light emitting lighting device of FIG. 1 will be described in further detail with reference to FIG. 2 to FIG. 4.

Figure 2:
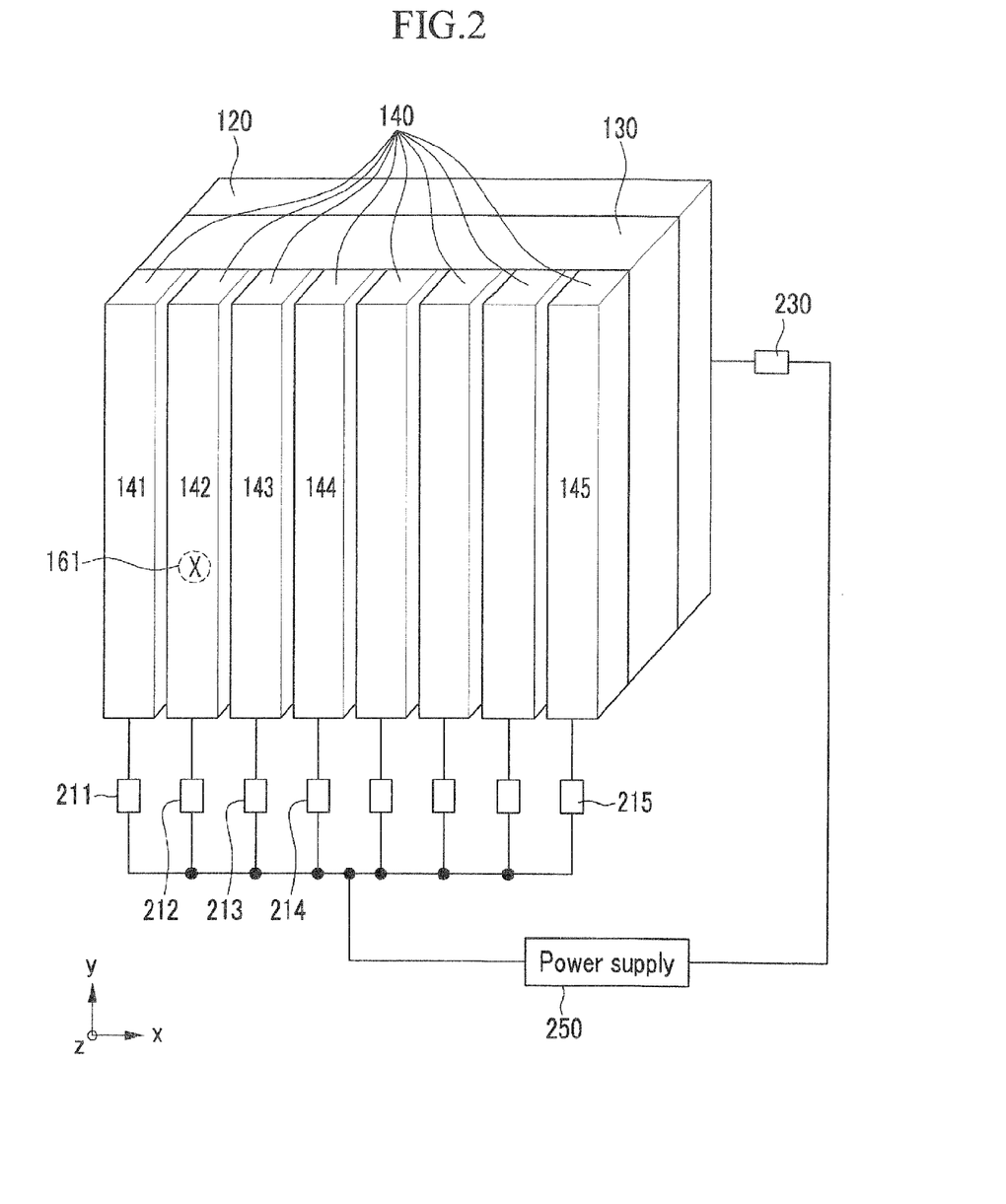
FIG. 2 shows an organic light emitting lighting device according to a first exemplary embodiment of the present invention.

FIG. 2 shows an organic light emitting lighting device according to a first exemplary embodiment of the present invention.

Referring to FIG. 2, an organic light emitting lighting device according to the first exemplary embodiment includes the first electrode 120 that is a single-side electrode. In addition, the organic light emitting lighting device further includes a first fuse 230 and a plurality of second fuse elements 211, 212, 213, 214, and 215 respectively connected to first ends of the respective second electrode lines 141, 142, 143, 144, and 145.

The organic light emitting lighting device may further include a power source unit 250 applying first and second voltages respectively to the first electrode 120 and the second electrode lines 141, 142, 143, 144, and 145. Here, the first voltage may be higher than the second voltage.

When a defect occurs at a point of an organic light emitting element, the first and second electrodes corresponding to the defect point experiences a phenomenon that is the same as a short circuit. That is, current deflection occurs so that the amount of current flowing to the defect point of the organic light emitting element is rapidly increased, and the defect point is brightened and other areas are darkened due to decrease of the light emission amount. Accordingly, the entire luminance of the screen becomes uneven and luminance of the area excluding the defect point is decreased. In addition, when power is continuously supplied through the first and second electrodes even though the defect occurs at one point of the organic light emitting element, the current deflection is gradually spread so that the entire organic light emitting element is damaged.

As in the first exemplary embodiment of the present invention, when a second electrode layer that is a cathode electrode is formed of a plurality of second electrode lines and a fuse is formed in each of the first and second electrode lines, power supply to the cathode electrode and the anode electrode can be separately controlled. For example, when a defect occurs at a point 161 of the organic emission layer, power supplied to the corresponding second electrode line 142 is blocked by using the second fuse 212. Accordingly, a luminance decrease in areas excluding the defect point can be prevented. In addition, when current deflection that has occurred due to the defect at the point 161 spreads, power supplied to the first electrode 120 can be blocked by using the fuse 230. Accordingly, damage to the entire organic light emitting element can be prevented.

The first fuse 230 has a first fuse capacity and the second fuse (e.g., 211) has a second fuse capacity. Here, the fuse capacity may imply a threshold current value that disconnects the fuse when the amount of current flowing through the fuse is greater than a predetermined threshold value. For example, a fuse through which more than 100 mA current flows has a capacity of 100 mA. When resistance is constant, the current is proportional to the voltage so that the fuse capacity may be represented by a voltage value.

If it is assumed that the second electrodes 141 to 145 are formed of 100 lines and current of 5 A flows to the organic light emitting element, 50 mA flows to a single second electrode line when no defect occurs. Thus, the organic light emitting element is partially deflected and current supply to three second electrode lines is blocked. Hereinafter, the second electrode to which the current supply is blocked is referred to as a second blocking electrode. Then, the current of 5 A should flow through 98 second electrode lines. Thus, a current of 5/98 (approximately 51 mA) which is greater than the amount of current (i.e., 50 mA) flowing through a single second electrode line when no defect occurs flows through a single second electrode line. In this case, if the fuse capacity is 51 mA, the plurality of second fuses may be disconnected when an increased current flows after the occurrence of the defect. Then, current supply to all the second electrode lines is blocked.

When a small number of electrode lines are blocked from current supply due to a defect with respect to all electrode lines, operation of all organic light emitting elements should be prevented from being stopped. Therefore, the fuse capacity is set to be greater by a predetermined margin than the amount of current flowing to the corresponding electrode line when no defect occurs. The predetermined margin is determined according to an allowable number of second electrodes that can be blocked among the plurality of second electrode lines. The fuse capacity may be set in consideration of specifications of the organic light emitting lighting device, resolution, or product reliability.

The first fuse 230 and the second fuse (e.g., 211) may be formed of various shapes such as a micro-sized chip, a metal material including lead, a polymer, or a compound of a monomolecular material and a polymer.

Capacity of the first fuse may be set to be different from that of the second fuse. As described above, fuse capacity may be represented by allowable intensity of current. Hereinafter, units of the first and second capacity are equal to a unit of a current. In the present exemplary embodiment, the first fuse capacity may be set to be greater than the second fuse capacity. It is assumed that a current flowing at a point 161 of the organic emission layer 130 is increased from the second fuse capacity to the first fuse capacity. Then, a second fuse 212 connected to a second electrode line 142 corresponding to the point 161 is disconnected when a current greater than the second fuse capacity flows, and a first fuse 230 connected to a first electrode 120 is disconnected when a current greater than the first fuse capacity flows. With the above configuration, power supply to the first electrode 120 and the second electrode line (e.g., 142) can be separately controlled according to the current flowing through the organic light emission layer 130 so that shut-down of the organic light emitting element and luminance decrease can be promptly prevented.

In addition, when a current instantly increasing from the second fuse capacity to the first fuse capacity flows, the first and second fuses 230 and 212 may be simultaneously disconnected.

Figure 3:
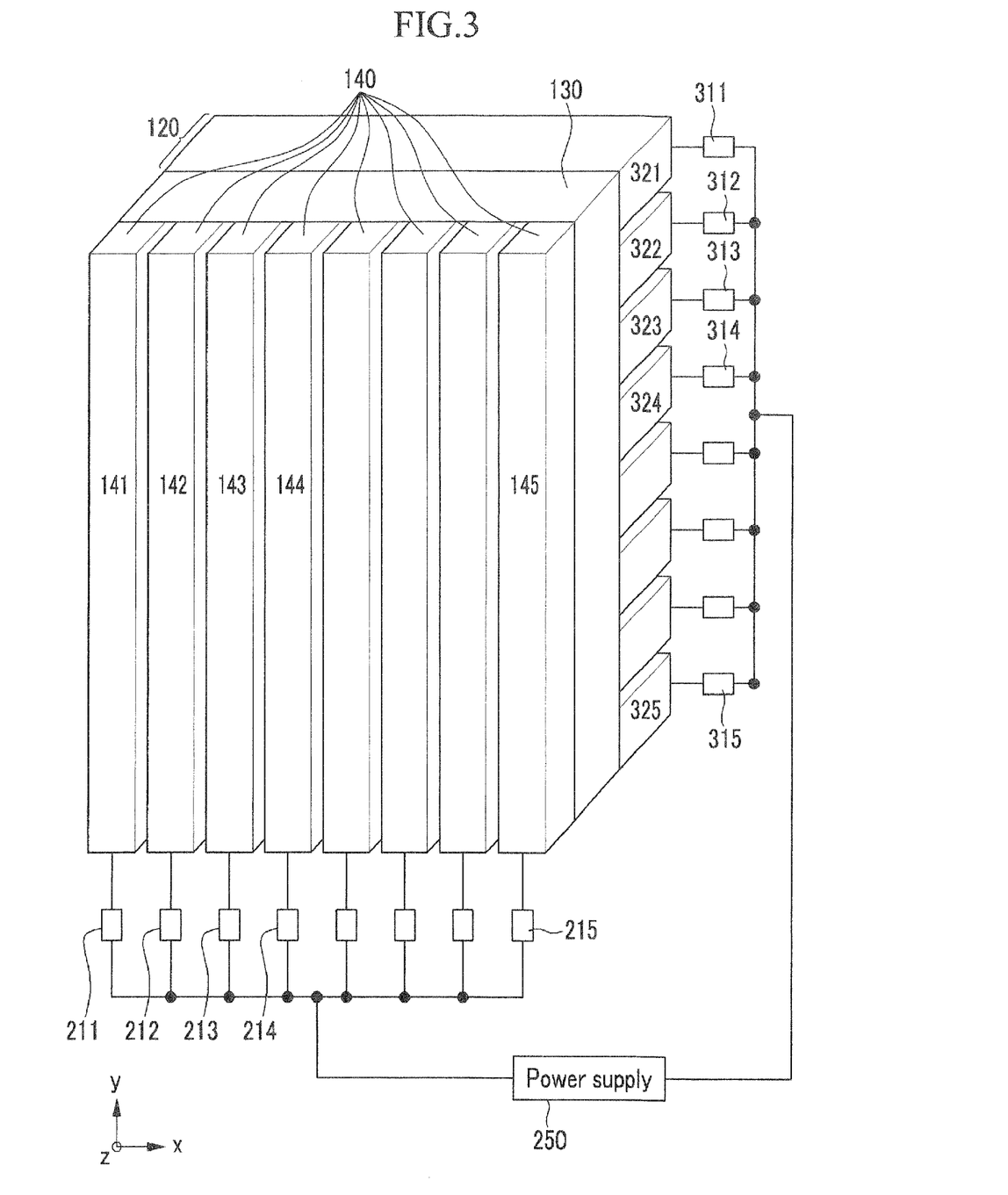
FIG. 3 shows an organic light emitting lighting device according to a second exemplary embodiment of the present invention.

FIG. 3 shows an organic light emitting lighting device according to a second exemplary embodiment of the present invention.

A first electrode layer 120 of the organic light emitting lighting device according to the second exemplary embodiment is formed of a plurality of first electrode lines 321, 322, 323, 324, and 325. In addition, the organic light emitting lighting device further includes a plurality of first fuses 311, 312, 313, 314, and 315 respectively connected to the plurality of first electrode lines 321, 322, 323, 324, and 325.

The first electrode lines 321, 322, 323, 324, and 325 are arranged in a direction that is perpendicular to the second electrode lines 141, 142, 143, 144, and 145. That is, the first electrode lines are extended in the y-axis direction and the second electrode lines are extended in the x-axis direction.

As in the organic light emitting lighting device of FIG. 2, the first fuses 311, 312, 313, 314, and 315 and the second fuses 211, 212, 213, 214, and 215 may be different in capacity.

For example, fuse capacity of the first fuses is set to cA and fuse capacity of the second fuses is set to dA. In addition, when a defect occurs at a crossing point of the first electrode line 322 and the second electrode line 142, an arbitrary current that increases cA (here, c>d) is applied to the first and second electrode lines 322 and 142. In this case, the second fuse connected with the second electrode line 142 is disconnected first and then the first fuse connected with the first electrode line 322 is disconnected. With the above-described configuration, power supply to the first and second electrode lines can be individually controlled when the arbitrary current flows through the organic light emitting element. That is, when a defect occurs at one point of the organic emission layer, first and second electrode lines corresponding to the defect point may be respectively disconnected from the power supply by the first and second fuses.

In addition, spread of a defect of the organic light emitting diode can be prevented to thereby replace or fix only the defective organic light emitting diode or electrode lines corresponding to the defect position.

Further, an insulation layer (not shown) or a separator may be further formed between two adjacent first electrode lines (e.g., 321 and 322).

Figure 4:
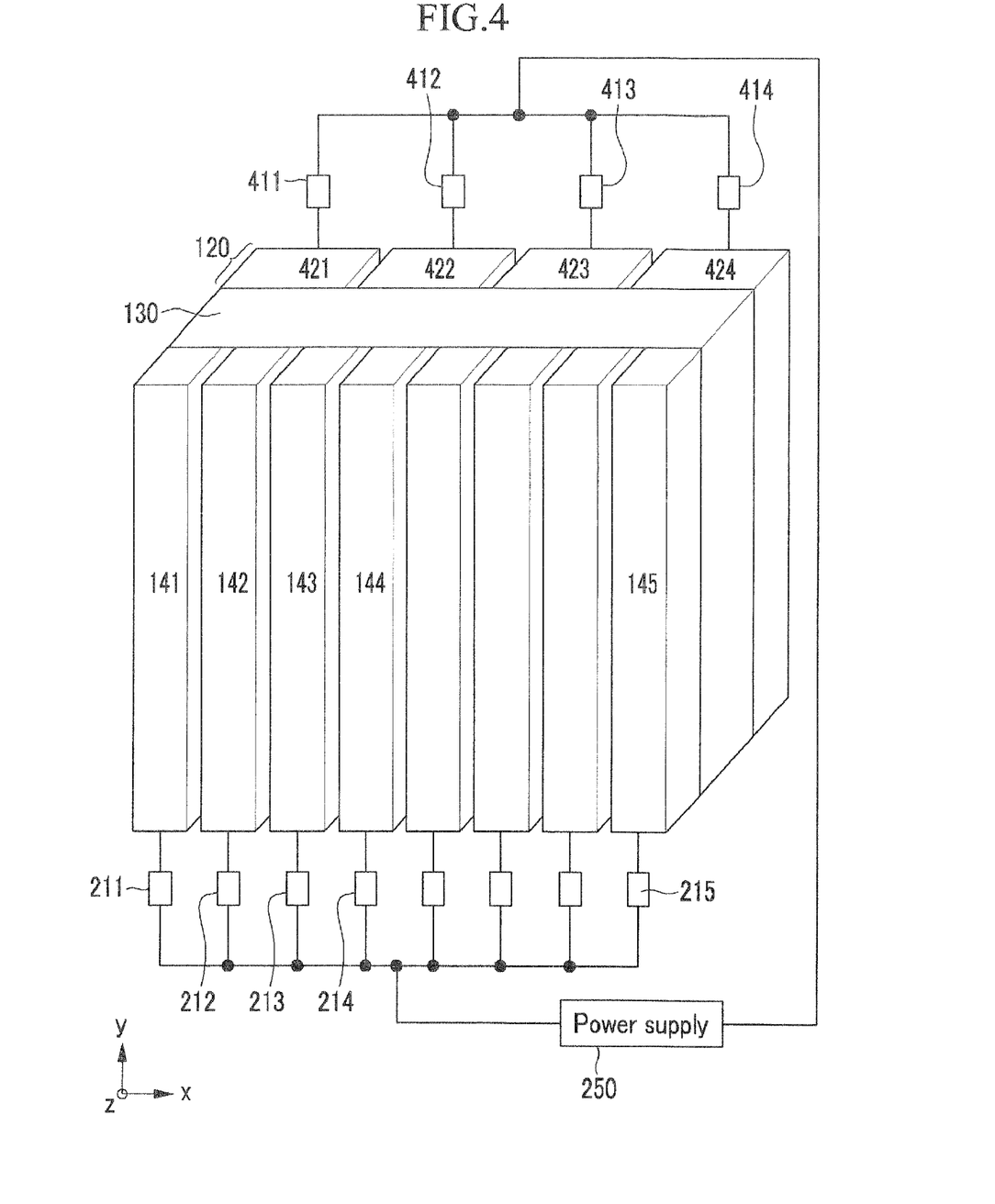
FIG. 4 shows an organic light emitting lighting device according to a third exemplary embodiment of the present invention.

FIG. 4 shows an organic light emitting lighting device according to a third exemplary embodiment of the present invention.

An organic light emitting lighting device according to the third exemplary embodiment has a first electrode layer 120 formed of a plurality of first electrode lines 421, 422, 423, and 424. In addition, the organic light emitting lighting device includes first fuses 411, 412, 413, and 414 respectively connected to the first electrode lines 421, 422, 423, and 424. Here, the first electrode lines 421, 422, 423, and 424 are disposed in parallel with second electrode lines 141, 142, 143, 144, and 145. That is, the first and second electrode lines are extended in the Y-axis direction in the drawing.

In the third exemplary embodiment, the total number of the first electrode lines and the total number of the second electrode lines are different from each other. FIG. 4 exemplarily illustrates that the total number of the first electrode lines is n and the total number of the second electrode lines is 2n.

Figure 5:
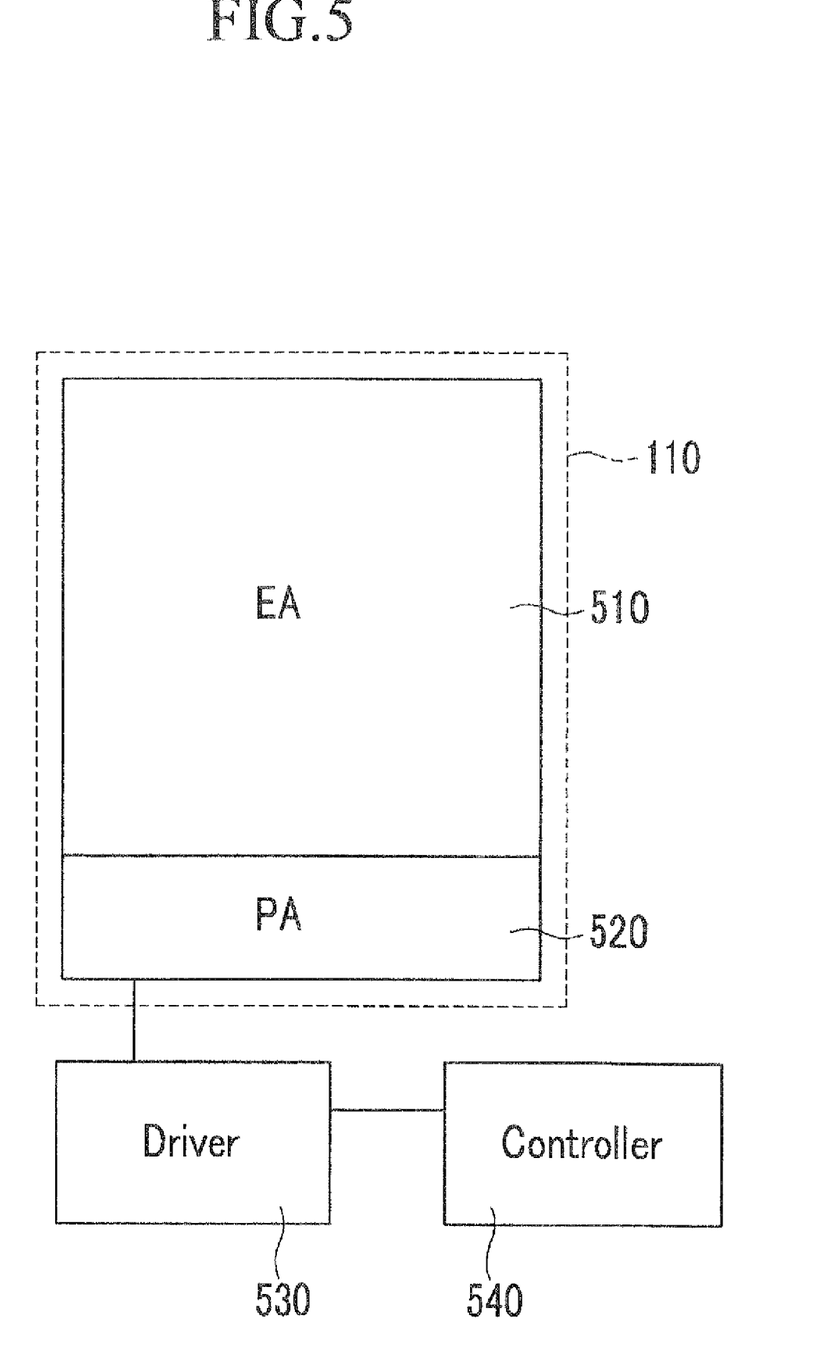
FIG. 5 is a layout view of an organic light emitting lighting device according to a fourth exemplary embodiment of the present invention.

FIG. 5 is a schematic diagram of an organic light emitting lighting device according to a fourth exemplary embodiment of the present invention.

The organic light emitting lighting device according to the fourth exemplary embodiment of the present invention includes a substrate 110 formed of a light emitting area EA 510 and a pad area PA 520, and a driver 530. In addition, the organic light emitting lighting device may further include a controller 540.

An organic light emitting diode (OLED) formed of a first electrode layer 120, an organic emission layer 130, and a second electrode layer 140 is disposed in the light emitting area +.

A first electrode and a plurality of second electrode lines extended from the light emission area 510 of the substrate 110 are disposed in the pad area 520. Here, the first electrode may have is a planar electrode structure or a plurality of first electrode lines. In addition, the first and second electrodes may be connected to the driver 530 through a connector (not shown) formed of a PCB or FPCB.

The driver 530 supplies predetermined first and second driving voltages to the plurality of first electrode lines (or the first electrode) and the plurality of second electrode lines. A voltage difference between the first driving voltage and the second driving voltage is maintained at a voltage for emitting the organic light emitting diode with luminance that is predetermined in design. The first and second driving voltages may be controlled by manipulation of a user. In further detail, the user increases the voltage difference if the user wants brighter luminance, and decreases the voltage difference if the user wants dark luminance.

The driver 530 may have the power supply 250 shown in FIG. 2 to FIG. 4.

The controller 540 controls the driver 530. The controller 540 senses manipulation of the user, and controls the driver 530 to generate the first and second driving voltages according to the manipulation of the user.

The first and second fuses shown in FIG. 2 to FIG. 4 may be disposed at the driver 530 or a part of the pad area 520 of the substrate 110. In addition, the first and second fuses may be stacked on a connector that connects the driver 530 and the pad area 520 of the substrate 110.

When the first and second fuses are stacked on the driver 530 or a part of the pad area 520 of the substrate 110, the size of the substrate 110 is reduced so that the size of the organic light emitting light device can be decreased. Further, the size of a non-light emission area can be reduced. Here, the pad area 520 where the first and second fuses are stacked may be a connector formed of a printed circuit board (PCB) or a flexible printed circuit board (FPCB).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting lighting device comprising:
a transparent substrate;
a first electrode layer formed on the substrate;
an organic emission layer formed on the first electrode layer;
a second electrode line formed of a plurality of second electrode lines disposed in parallel with each other on the organic emission layer;
a first fuse unit having one end connected with the first electrode layer; and
a plurality of second fuses having one end respectively connected to one end of the plurality of second electrode lines.

2. The organic light emitting lighting device of claim 1, wherein the first electrode is an anode and the second electrode line is a cathode.

3. The organic light emitting light device of claim 2, wherein the first electrode layer is formed of a first electrode that is one planar electrode, and the first fuse unit is formed of a fuse having one end connected with the first electrode.

4. The organic light emitting lighting device of claim 3, wherein the fuse capacity of the first fuse is different from that of the second fuse.

5. The organic light emitting lighting device of claim 4, wherein the fuse capacity of the first fuse is greater than that of the second fuse.

6. The organic light emitting lighting device of claim 2, wherein the first electrode layer is formed of a plurality of first electrode lines that are disposed in parallel with each other.

7. The organic light emitting lighting device of claim 6, wherein the first fuse unit is formed of a plurality of first fuses having one end respectively connected to one end of the plurality of first electrode lines.

8. The organic light emitting lighting device of claim 7, further comprising a power supply connected with the other end of the first fuse and applying a first voltage to the first electrode line, and connected to the other end of the second fuse and applying a second voltage that is lower than the first voltage to the second electrode line.

9. The organic light emitting lighting device of claim 6, wherein the second electrode line is perpendicular to the first electrode line.

10. The organic light emitting lighting device of claim 6, wherein the second electrode line is parallel with the first electrode.

11. The organic light emitting lighting device of claim 10, wherein the number of the first electrode lines is different from the number of the second electrode lines.

12. The organic light emitting lighting device of claim 6, further comprising an insulation layer or a separator formed between neighboring first electrode lines.

13. The organic light emitting lighting device of claim 2, wherein the first fuse unit or the plurality of fuses are formed on the substrate.

14. The organic light emitting lighting device of claim 2, wherein the first fuse unit or the plurality of fuses are formed on a driver that drives the organic emission layer for light emission.

15. The organic light emitting lighting device of claim 2, wherein the first fuse unit or the plurality of fuses are formed on a pad area that connects the organic emission layer and the driver that drives the organic emission layer for light emission.

16. The organic light emitting lighting device of claim 2, further comprising an insulation layer or a separator formed between neighboring second electrode lines.

17. An organic light emitting lighting device, comprising:
a transparent substrate;
a first electrode layer having a plurality of anode electrodes that are parallel to each other and formed on the substrate;
an organic emission layer formed on the first electrode layer;
a second electrode line formed of a plurality of second electrode lines disposed in parallel with each other on the organic emission layer, said plurality of second electrodes lines are cathode electrodes;
a plurality of first fuse units each having one end connected to each of the plurality of anode electrodes of the first electrode layer; and a plurality of second fuses each having one end respectively connected to one end of each the plurality of second electrode lines, wherein power is cut to a second electrode line of the plurality of second electrode lines by a corresponding second fuse of the plurality of second fuses upon detection of a defect at a corresponding point of the organic emission layer, wherein power is cut to an anode electrode of the plurality of anode electrodes by a corresponding first fuse of the plurality of first fuses upon current deflection occurring due to said defect at said corresponding point of the organic emission layer.

* * * * *